(12) United States Patent
Futrell et al.

(10) Patent No.: US 6,238,824 B1
(45) Date of Patent: May 29, 2001

(54) METHOD FOR DESIGNING AND MAKING PHOTOLITHOGRAPHIC RETICLE, RETICLE, AND PHOTOLITHOGRAPHIC PROCESS

(75) Inventors: John R. Futrell, Boise, ID (US); Christophe Pierrat, Santa Clara, CA (US); William Stanton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/386,314

(22) Filed: Aug. 31, 1999

(51) Int. Cl.[7] .............................. G03F 9/00; G03F 3/00; G06F 3/00
(52) U.S. Cl. ............................................ 430/5; 395/500.22
(58) Field of Search .................... 430/5, 322; 355/53, 355/51, 77; 382/144, 145, 147; 395/500.22

(56) References Cited

U.S. PATENT DOCUMENTS

| | | | |
|---|---|---|---|
| 5,475,766 | 12/1995 | Tsuchiya et al. | 382/144 |
| 5,723,233 | 3/1998 | Garza et al. | 430/5 |
| 5,847,421 | 12/1998 | Yamaguchi | 257/207 |
| 5,900,338 | * 5/1999 | Garza et al. | 430/5 |
| 5,917,932 | * 6/1999 | Hartley | 382/144 |

\* cited by examiner

*Primary Examiner*—S. Rosasco
(74) *Attorney, Agent, or Firm*—Dickstein Shapiro Morin & Oshinsky LLP

(57) ABSTRACT

There are provided methods for making a reticle for use in a photolithography process, comprising generating an first reticle layout having at least one printable reticle feature, generating a modified reticle layout having the first reticle layout and at least one correction area, generating an alignment budget-containing reticle layout having at least one different printable reticle feature and at least one alignment budget border area, and removing from the modified reticle layout any area of overlap between the at least one correction area and the at least one alignment budget border area. There are also provided reticles formed according to such methods. In addition, there are provided computer-implemented methods for designing such a reticle, as well as computer readable storage media, and computer systems for use in making such reticles. In addition, there are provided photolithographic processes using such a reticle.

60 Claims, 5 Drawing Sheets

METHOD FOR DESIGNING AND MAKING PHOTOLITHOGRAPHIC RETICLE, RETICLE, AND PHOTOLITHOGRAPHIC PROCESS

FIELD OF THE INVENTION

The present invention relates generally to the field of semiconductor fabrication, more particularly, to a reticle for use in a photolithography process during semiconductor fabrication, and a method for designing such a reticle.

BACKGROUND OF THE INVENTION

In the manufacture of semiconductor chip devices, photolithographic processes are often used to pattern various layers on a wafer in order to produce circuit features (e.g., transistors, polygates and interconnects) positioned as specified in a circuit feature layout. Typically, a circuit feature layout calls for different circuit features to be provided in different layers and/or through different combinations of layers of the chip devices. Examples of circuit feature layouts which include such circuit features positioned in such relationships are numerous. An example of a device having such a circuit feature layout is one which includes multiple layers, at least one of the layers having one or more conductive paths (e.g., digitlines), and at least one interconnect passing through two or more of the layers but not making contact with the conductive path(s). In manufacturing such a device, it is common to form the one or more conductive paths by patterning a conductive layer in one photolithographic patterning step, and subsequently (e.g., after applying one or more layers over the conductive layer) to form the interconnect(s) using a separate photolithographic patterning step.

In each of such photolithographic processes, a layer of photo resist is deposited on the layer being patterned, and the resist is then exposed using an exposure tool and a template. These templates are known in the art as reticles or masks. For purposes of the present application, the term reticle includes both reticles and masks. During the exposure process, the reticle is typically placed over the resist, and then a form of radiant energy such as ultraviolet light is directed toward the reticle to selectively expose the resist in a desired pattern. A preferred device for creating such exposure is known as a stepper.

In performing such photolithographic processes on a device which is being manufactured, it is necessary to align each reticle relative to the device under fabrication. There are a number of ways of providing such alignment, one common way being to provide for accurate alignment of the device relative to the stepper, as well as accurate alignment of each reticle relative to the stepper. One common way of providing such accurate alignment is by providing alignment marks on the device, which can be aligned with corresponding marks on the stepper. Other alignment techniques could be used, e.g., positioning one or more edges of the device in contact with a mating surface in the stepper, registering a notch in the edge of the device with an engaging structure in the stepper, registering a hole in the device with an engaging structure in the stepper, etc. Likewise, each reticle is accurately aligned with the stepper using a suitable alignment technique. In practice, such alignment can only be guaranteed within certain limits. Accordingly, different reticles used in different steps in the manufacture of a semiconductor device can be misaligned up to a maximum amount referred to herein as the alignment budget therefore the alignment errors will produce defective product.

One type of reticle which is commonly used in photolithographic processes is referred to as a binary reticle. A binary reticle includes reticle features, namely transparent features (areas through which exposure passes) and opaque features (areas which block exposure). The design of the reticle features is typically shown in a two-dimensional reticle layout, although the reticle itself typically includes two or more layers (e.g., a transparent layer and a patterned opaque layer). In use, radiant energy is directed toward the binary reticle, and the radiant energy is blocked by the opaque areas but passes through the transparent areas to pattern-wise expose the resist. After pattern-wise exposure, the resist is developed to remove either the exposed portions of the resist (a positive resist) or the unexposed portions of the resist (a negative resist), thereby forming a patterned resist on the layer being patterned. The patterned resist is then used to protect a corresponding pattern of underlying areas on the layer during subsequent fabrication processes, such as deposition, etching or ion implantation processes. Thus, the patterned resist prevents or substantially prevents the effects of the fabrication process(es) from being produced in the layer in areas of the layer which lie beneath portions of the resist which have not been removed. The reticle is designed so as to enable exposing the resist in a pattern which corresponds to the feature or features which are desired to be formed.

There are a number of effects caused by diffraction of exposure which tend to distort the patterns formed in a resist, i.e., which cause the pattern formed in a resist to differ from the pattern formed in the reticle.

Due to limitations imposed by the wavelength of light used to transfer the pattern, resolution degrades at the edges of the patterns of the reticle. Such degradation is caused by diffraction of the exposure such that it is spread outside the transparent areas. Phase shift masks (PSMs) have been used to counteract these diffraction effects and to improve the resolution and depth of images projected onto a target (i.e., the resist covered wafer). There are a variety of PSMs. One kind of PSM includes a phase shifting layer having areas which allow close to 100% of the exposure to pass through, but phase shifted 180 degrees relative to exposure passing through a transparent layer. Attenuated PSMs utilize partially transmissive regions which pass a portion of the exposure, e.g., about three to eight percent, out of phase with exposure through transparent areas. Typically, the shift in phase is 180 degrees, such that the portion of exposure passing through the partially transmissive regions destructively interferes with exposure which is spread outside the transparent areas by diffraction. Phase shift masks can thereby increase image contrast and resolution without reducing wavelength or increasing numerical aperture. These masks can also improve depth of focus and process latitude for a given feature size. Designs of such reticles typically are represented using one or more two-dimensional reticle layouts including appropriate reticle features, e.g., selected from among transparent features, opaque features, phase shifting features and phase shifting attenuating features.

There has been an ongoing need to increase the density of features contained in semiconductor devices, by making the features smaller and/or reducing the amount of space between features. Advances in feature density have required that reticles include correspondingly smaller and/or more densely packed features. The extent to which features printed by photolithographic methods can be reduced in size is limited by the resolution limit of the exposure tool. The resolution limit of an exposure tool is defined as the minimum feature dimension that the exposure tool can repeatedly expose onto the resist, and is a function of the wavelength of exposure emitted by the stepper, the aperture through which exposure is emitted, the depth of focus and other factors. Thus, reticle design is limited in that the gaps between respective features on the reticle (i.e., transparent regions, opaque regions and/or phase shifted regions) must be large enough for the circuit features to be correctly printed.

The critical dimension (CD) of a circuit pattern is defined as the smallest width of a line in the pattern, or the smallest space between lines in the pattern. The CD thus directly affects the size and density of the design. As the density of features in a pattern is increased, the CD of the design approaches the resolution limit of the stepper. As the CD of a circuit layout approaches the resolution limit of the stepper, the diffraction of exposure causes increasingly significant distortions of the pattern being created.

These distortions are known as optical proximity effects. The primary optical proximity effects are that corners of features are rounded, isolated features print differently from identically shaped and sized semi-isolated or densely packed features, smaller features are printed relatively smaller than larger features, and relatively thin line features are shortened. Features which are in close proximity to other features tend to be more significantly distorted than features which are relatively isolated from other features. Furthermore, optical proximity effect distortion is compounded by subsequent processing step distortions such as resist processing distortions and etching distortions.

As a result, many accuracy-enhancing design techniques have been developed, with the goal being to reduce such distortion by creating a modified reticle layout. Such techniques include those referred to in the art as optical proximity correction (OPC) techniques, and involve generating an initial reticle layout corresponding to features in the circuit feature layout, and adding and/or subtracting areas to the initial reticle layout to produce a modified reticle layout. The additions and/or subtractions are designed such that the pattern formed by exposure through the modified reticle layout will more closely correspond to the desired pattern. Typically, OPC is performed by using software which evaluates a digital representation of an initial reticle layout to identify regions where distortion will occur, and to modify the sizes and/or shapes of the elements in the initial reticle layout to produce the modified reticle layout. However, the expression OPC, as used in the present specification refers to any modification of a shape corresponding to a feature, e.g., modifications generated by known software routines, modifications made manually by the manufacturer (such as by trial and error) and modifications made by software routines not known in the art.

U.S. Pat. No. 5,821,014 discloses a method comprising using scattering bars between features for correcting for proximity effects. According to the patent, scattering bars are correction features (typically non-resolvable) that are placed next to isolated edges on a mask in order to adjust the edge intensity at the isolated edge to match the edge intensity at a densely packed edge.

U.S. Pat. No. 5,723,233 discloses an optical proximity correction method for mask layouts. The method includes performing pattern recognition on a layout design to identify locations of feature edges with respect to other feature edges in the layout design. The method further includes obtaining an optical proximity correction for at least one of the feature edges by evaluating one or more non-linear mathematical expressions for optical proximity correction at the location of that edge with respect to other feature edges.

U.S. Pat. No. 5,707,765 discloses a method of making a photolithography mask that utilizes serifs to increase the correspondence between an actual circuit design and the final circuit pattern on a semiconductor wafer. The mask uses a plurality of serifs having a size determined by a resolution limit of the optical exposure tool used during the fabrication process. The serifs are positioned on the corner regions of the mask such that a portion of surface area for each of the serifs overlaps the corner regions of the mask. The size of the serifs is about one-third the resolution limit of the optical exposure tool.

After conducting an initial OPC, the modified reticle layout is preferably checked to analyze differences between the pattern that will be produced on a resist (the printed circuit pattern) and the desired circuit feature layout. Depending on these differences, additional modifications can be made to the modified reticle layout, which may include changes to one or more of the features in the modified reticle layout.

When manufacture of a semiconductor device requires more than one photolithographic process, as described above and as is typically the case, the device being manufactured and each of the reticles are aligned relative to one another within specific alignment budgets. Known OPC methods do not take such alignment budgets into account. As the features in circuit feature layouts are more densely packed, there is an increasingly larger chance that features which are designed to be electrically insulated from one another will be in contact with one another due to the alignment budgets.

In addition, after patterning a resist, processing steps are taken, e.g., etching, material deposition, etc., in order to form the circuit features in accordance with the pattern formed in the resist. In carrying out such processing steps, there typically is introduced further deviation from the original design of the features. The maximum extent of such deviations are referred to herein as processing budgets.

There is an ongoing need for methods of designing reticles which can be used to form features which are packed in patterns which are increasingly more dense, while reducing or eliminating printing errors and decreasing the variance between the actual exposure pattern and the desired exposure pattern. In addition, there is a need for methods of designing such reticles in which alignment budgets are taken into account. Furthermore, there is a need for such methods in which processing budgets are also taken into account.

SUMMARY OF THE INVENTION

The present invention provides a method for designing reticles which can be used to produce circuit designs having densely packed circuit features, in which alignment budgets are taken into account, in which the occurrence of printing errors is reduced or eliminated, and in which the variance between the actual exposure pattern and the desired exposure pattern is reduced. The present invention also provides a method for designing such reticles in which processing budgets are also taken into account.

According to the present invention, there are provided reticle designs in which one or more reticle features are corrected using OPC, alignment budget borders are added to one or more reticle features, and any area of overlap of the alignment budget borders (or the reticle features) and correction areas added by the correction of reticle features is removed from the correction areas to form one or more modified correction areas. The present invention is applicable to all types of reticles, i.e., binary masks and phase shift masks (including attenuated phase shift masks).

In practicing one aspect of the method of this invention, for each layer in the semiconductor device, a circuit layout is generated which contains any circuit features which will be present in that layer. The circuit layout is conceptually broken into two or more circuit layout portions, each of which is to be patterned using a different reticle. An initial reticle layout is generated for each of the circuit layout portions. Each initial reticle layout includes printable reticle features which are sized, shaped and positioned similarly to the corresponding circuit features, with each printable reticle feature corresponding to a separate circuit feature in the circuit layout.

One or more of the initial reticle layouts is modified according to an OPC technique in order to generate one or more modified reticle layouts. Such modifications are designed such that if exposure were directed through a reticle having such a modified reticle layout onto a resist, the resist would be exposed in a pattern which includes features which more closely approximate the corresponding features in the circuit layout. The one or more modified reticle layouts may be generated using any correction technique, and the present invention is not limited in any sense by the types of corrections or the manner of generating those corrections. The area, if any, which is added to any particular printable reticle feature through such modification is referred to herein as the correction area for the corresponding circuit feature.

At least one of the initial reticle layouts (i.e., a reticle layout, if any, which has not been modified) and/or at least one of the modified reticle layouts is then modified by adding an alignment budget border around the outside of each reticle feature in the reticle layout to generate one or more corresponding alignment budget-containing reticle layouts.

All of the reticle layouts for the layer under consideration are then conceptually overlaid on one another to check for any overlap between any correction areas corresponding to one feature and any alignment budget border areas corresponding to any other feature. If any such overlap exists, such overlap is deleted from the correction area(s) to form modified correction area(s), thereby forming a pre-final reticle layout for each reticle. Any alignment budget border areas are then removed from each pre-final reticle layout to form a final reticle layout for each reticle. The final reticle layouts are then sent to a mask shop, where each reticle is manufactured according to the corresponding final reticle layout.

Additionally, the present invention provides methods of forming reticles as described above, in which processing budgets are included in the alignment budgets described above.

The present invention also relates to reticles which are formed in accordance with a final reticle layout formed in the manner described above.

The present invention is further directed to integrated circuits which incorporate one or more components made using any of the reticles according to the present invention, e.g., the reticles of the present invention can be used in making such components.

These and other features and advantages of the invention will become more readily apparent from the following detailed description of preferred embodiments of the present invention, which is provided in conjunction with the accompanying drawings. The invention is not limited to the exemplary embodiments described below and it should be recognized that the invention includes all modifications falling within the scope of the attached claims.

DETAILED DESCRIPTION OF PREFERRED EMBODIMENTS OF THE INVENTION

The present invention provides a method for designing reticles which can be used to produce circuit designs having densely packed circuit features, in which alignment budgets are taken into account, in which the occurrence of printing errors is reduced or eliminated, and in which the variance between the actual exposure pattern and the desired exposure pattern is reduced. The present invention also provides a method for designing such reticles in which processing budgets are also taken into account.

Figure 1:
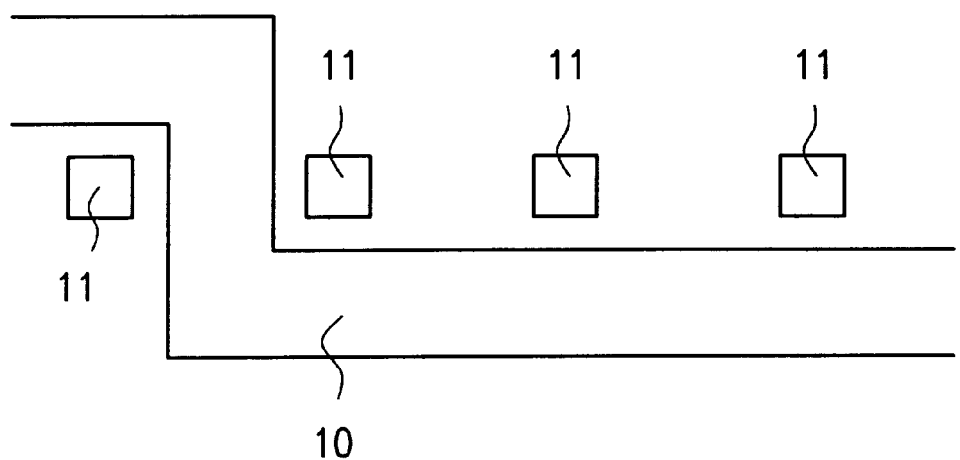
FIG. 1 is a partial schematic top view of a circuit layout for a single layer of a semiconductor device.

Referring now to the drawing figures, FIG. 1 is a partial schematic view of a circuit layout for a single layer of a semiconductor device. In this embodiment, there are provided a conductive feature 10 (e.g., a digitline) running in a horizontal direction, i.e., parallel to the major axes of the layer, and contacts 11 (e.g., interconnects) running in a vertical direction, i.e., perpendicular to the major axes of the layer. A common way of manufacturing such a layer is to first form the conductive feature 10 by patterning using a first reticle (not shown) and later form the contacts 11, which pass through at least several layers, but which are designed to not be in electrical communication with the conductive feature 10, using a second reticle. The present invention, in one aspect, addresses problems which have occurred in the past with regard to aligning such features, despite the fact that they are formed at different times using different reticles, and despite the fact that the different reticles may not be aligned in precisely the same position relative to the stepper.

Figure 2A:
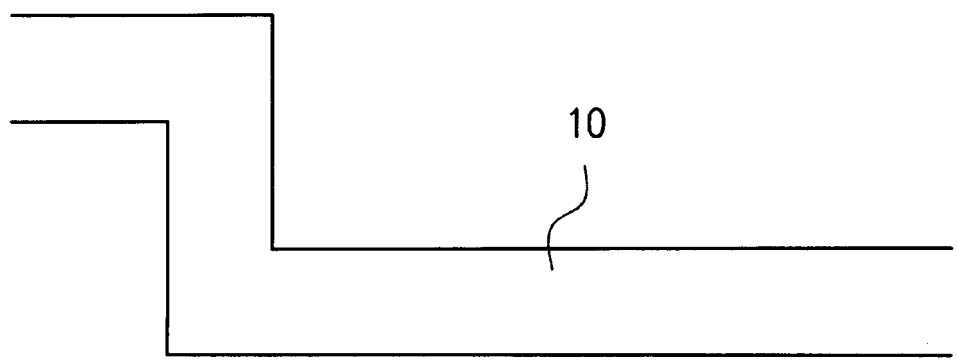
FIG. 2A is a partial schematic top view of a circuit layout portion containing circuit features from the circuit layout of FIG. 1 which are to be formed using a first reticle.
Figure 2B:
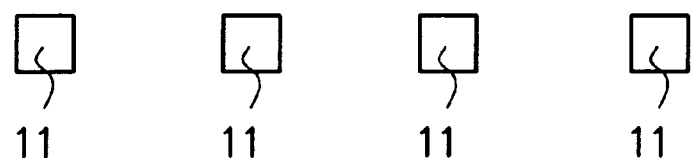
FIG. 2B is a partial schematic top view of a circuit layout portion containing circuit features from the circuit layout of FIG. 1 which are to be formed using a second reticle.

According to the present invention, the circuit layout for the layer is conceptually divided into two circuit layout portions, one for the reticle which will be used to pattern the conductive feature 10 (depicted in FIG. 2A) and one for the reticle which will be used to pattern the contacts 11 (depicted in FIG. 2B).

An initial reticle layout is generated for each of the circuit layout portions. Each initial reticle layout includes printable reticle features which are sized, shaped and positioned similarly to the corresponding circuit features, with each printable reticle feature corresponding to a separate circuit feature in the circuit layout. In the present embodiment, a first initial reticle layout includes the conductive feature 10, and a second initial reticle layout includes the contacts 11.

One or more of the initial reticle layout portions is then modified by any OPC technique to generate one or more modified reticle layout portions such that if exposure were directed through a reticle having such a modified reticle layout onto a resist, the resist would be exposed in a pattern which includes features which more closely approximate the corresponding features in the circuit layout. The one or more modified reticle layout portions may be generated using any known technique, for instance, be generated completely through trial and error, through experience with particular reticle layouts, or by using one of the many known OPC algorithms. The generation of the modified reticle layout portions according to the present invention is not limited to any particular method or algorithm.

Figure 3A:
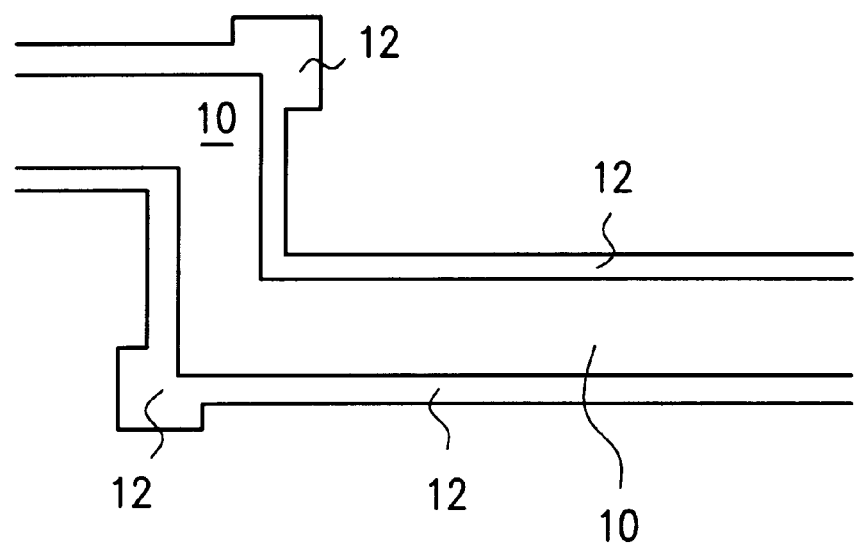
FIG. 3A is a partial schematic top view of a modified reticle layout based on an initial reticle layout corresponding to the circuit layout portion shown in FIG. 2A.

In the embodiment depicted in the present drawing Figures, the conductive feature 10 of the initial reticle layout portion is modified according to an OPC algorithm to generate a modified reticle layout. As shown in FIG. 3A, the modified reticle layout portion includes the conductive feature 10 plus correction areas 12.

At least one of the initial reticle layouts and/or at least one of the modified reticle layouts is then modified by adding an alignment budget border around the outside of each reticle feature contained in the reticle layout to generate one or more corresponding alignment budget-containing reticle layout. The width of the one or more alignment budget borders is determined based on the alignment budget for the apparatus being used, i.e., based on the maximum tolerable distance that printable reticle features on different reticles can be shifted relative to one another when placed in the stepper or steppers being used. The size of an alignment budget can be determined through calculation or through empirical study. A representative example of a suitable alignment budget is on the order of 70 nanometers. Preferably, alignment budget areas are added to only one of each pair of adjacent reticle features which are to be patterned using different reticles.

Figure 3B:
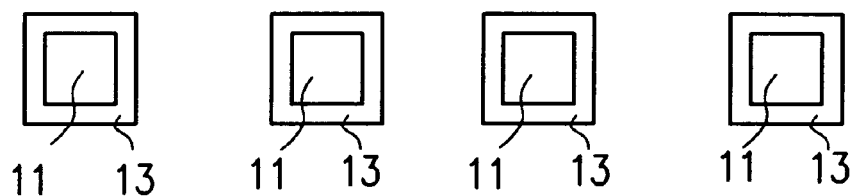
FIG. 3B is a partial schematic top view of an alignment budget-containing reticle layout based on an initial reticle layout corresponding to the circuit layout portion shown in FIG. 2B.

In the embodiment shown in the present drawing Figures, the contacts 11 are modified by adding alignment budget borders to generate an alignment budget-containing reticle layout. Referring to FIG. 3B, the alignment budget-containing reticle layout includes the contacts 11 plus alignment budget borders 13. In the present embodiment, the contacts 11 are not modified to generate a modified reticle layout portion, but the present invention would encompass embodiments where the contacts 11 are modified according to any OPC technique. Any such OPC correction, if employed, is preferably completed before adding the alignment budget borders 13.

Each of the reticle layouts for the layer under consideration, each of which may have been modified by addition of correction area and/or modified by addition of an alignment budget border, or which may have not been modified at all, are then laid over one another to check for any overlap between any correction areas corresponding to one feature and any alignment budget border areas corresponding to any other feature. If any such overlap exists, such overlap is deleted from the correction area to form a pre-final reticle layout for each reticle.

Figure 4:
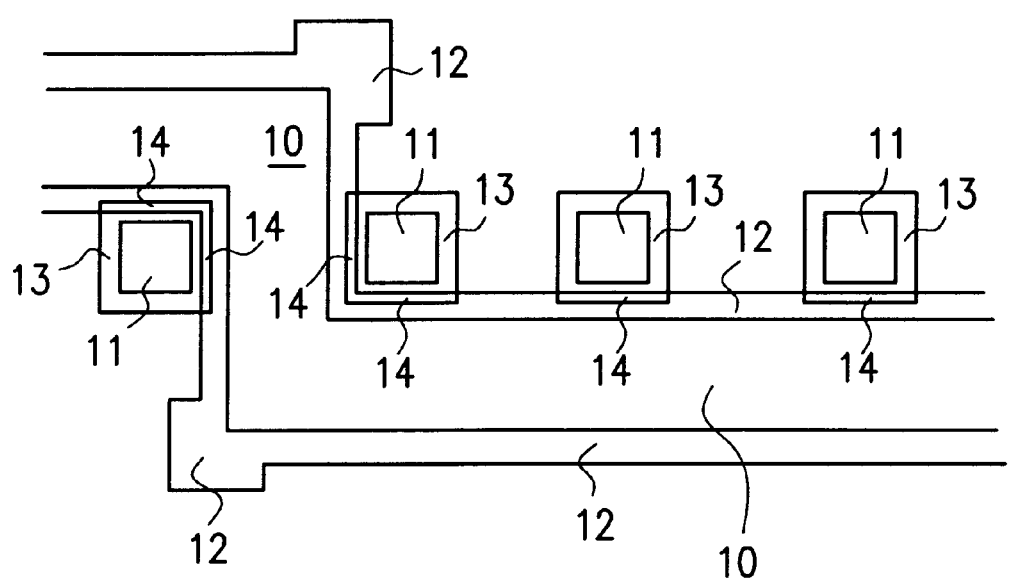
FIG. 4 is a view showing the modified reticle layout shown in FIG. 3A overlaid on the alignment budget-containing reticle layout shown in FIG. 3B.

FIG. 4 shows the modified reticle layout shown in FIG. 3A overlaid on the alignment budget-containing reticle layout shown in FIG. 3B. The overlay shown in FIG. 4 includes the conductive feature 10, contacts 11, correction areas 12 and alignment budget borders 13. FIG. 4 shows areas of overlap 14 where the alignment budget borders 13 overlap the correction areas 12. In accordance with the present invention, such areas of overlap 14 are deleted from the correction areas 12.

Figure 5:
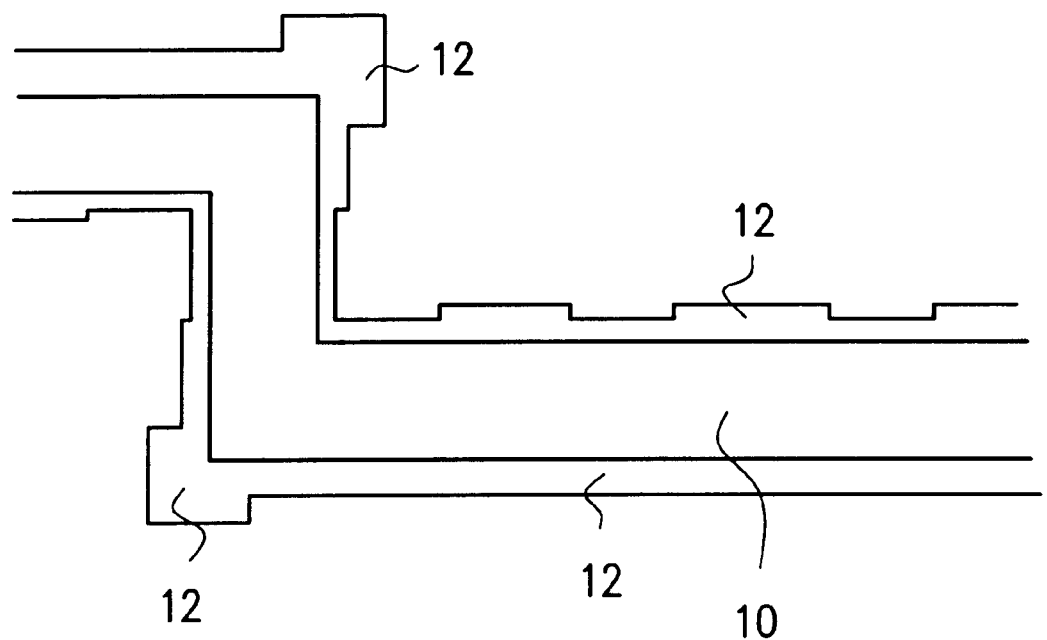
FIG. 5 is a final reticle layout based on the modified reticle layout of FIG. 3A, from which areas of overlap have been removed.

FIG. 5 is a pre-final reticle layout based on the modified reticle layout of FIG. 3A, from which areas of overlap 14, as shown in FIG. 4, have been removed. Since the alignment budget-containing reticle layout shown in FIG. 3B has no correction areas, the pre-final reticle layout for this reticle is the same as the layout in FIG. 3B.

Figure 6:
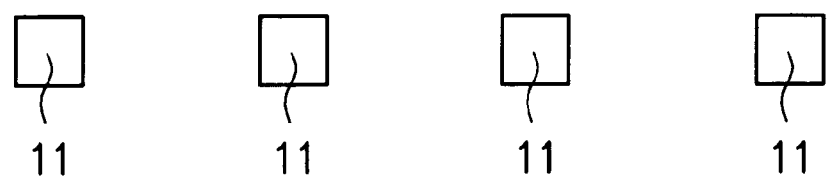
FIG. 6 is a final reticle layout based on the alignment budget-containing reticle layout of FIG. 4, from which all alignment budget borders have been removed.

Next, any alignment budget borders 13 are removed from each pre-final reticle layout to form a final reticle layout. FIG. 6 is a final reticle layout based on the pre-final reticle layout of FIG. 3B, from which the alignment budget borders 13 have been removed. Since the pre-final reticle layout of FIG. 5 has no alignment budget borders, the final reticle layout for this reticle is the same as the layout in FIG. 5.

The final reticle layouts are then sent to a mask shop, where reticles are manufactured according to the final reticle layouts.

Additionally, as mentioned above, the present invention provides methods of forming reticles as described above, in which processing budgets are included in the alignment budgets described above. The width of any such processing budget is preferably determined through empirical study (e.g., by performing a number of etching steps and analyzing the maximum degree of variance of actual etching from a pattern in a resist through which the etchant is supplied. Alternatively, processing budgets can be determined by any other method, e.g., by calculation or through comparison with other known processing budgets. Such processing budgets are added to the alignment budget when determining the size of the borders 13 in, for example, the FIG. 3B layout.

When making a binary mask corresponding to a final reticle layout, if the conductive feature(s) 10, the contact(s) 11 and/or the correction area(s) 12 are formed of transparent material, the remaining areas would be formed of opaque material, and vice-versa. As mentioned above, the present invention is also directed to phase shift masks, including attenuated phase shift masks. In the case of phase shift masks, if the conductive feature(s) 10, the contact(s) 11 and the correction area(s) 12 are formed of a transparent material, the remaining areas would be formed of a phase shift material, and vice-versa.

Prior to making a mask, the final reticle layout is preferably checked to analyze differences between the circuit layout and the pattern that will be produced on a resist by exposure through a reticle formed according to the corresponding final reticle layout. Depending on those differences, additional modifications can be made to the final reticle layout by repeating the procedure described above. Such additional modifications may include further changes generated by an OPC technique, re-inserting alignment budget borders, removing any areas of overlap, and removal of the alignment budget borders.

Examples of simulation software that can be used to determine the pattern which will be produced on a resist by exposure through a reticle formed according to the final reticle layout include FAIM by Vector Technologies of Boston, Mass., SPLAT by the University of Berkeley, Calif. and PROLITH by Finle Technologies of Piano, Tex. The simulated image data can then be fed to a design rule checker or data integrity verification and correction program where it is compared to the data comprising the desired circuit feature layout. If the simulated image correlates with the circuit layout within predetermined parameters or design rules, the final reticle layout is then sent to a mask shop for manufacture of a reticle corresponding to the final reticle layout. However, if the simulated image differs from the desired circuit feature layout by more than the design limits, further modifications may be made to the final reticle layout to counteract the areas of excessive variance from the circuit layout. The further modified reticle layout can then be run through the simulation and checking software again to check for excessive variances. These steps can be repeated until the simulated images correlate with the circuit layout within the design limits.

Various different types of design rule checker programs can be used to perform the data integrity verification and correction analysis. Examples of suitable software include CATS by Transcription Enterprises Limited of Los Gatos, Calif., iv Verify by Cadence System Inc. of San Jose, Calif., CheckMate by Mentor Graphics, Wilsonville, Oreg. and VeriCheck by Integrated Silicon System of Research Triangle Park, N.C.

A preferred material for use in making the transparent portions of a reticle is quartz, however, any suitable transparent material, e.g., soda-lime glass, borosilicate glass, or other similar natural or synthetic substances can be used. Those of skill in the art can readily select an appropriate material for use in making the transparent portions of a reticle.

A preferred material for use in making opaque portions (if present) of a reticle is chrome, however, any suitable opaque material can be used. Those of skill in the art can readily select an appropriate material for use in making the opaque portions of a reticle.

Similarly, those of skill in the art can readily select appropriate materials for use in making phase shifting portions (if present) and phase shifting attenuating portions (if present) of a reticle. For example, a preferred material for use in making an attenuated phase shifting layer is molybdenum silicide (MoSi), however, any suitable partially light transmissive, phase shifting material can be used. Another material which has been used to form attenuated phase shifting layers is a leaky chrome, which is a mixture of chrome, nitrogen and oxygen.

The present invention is further directed to any sequence of process steps which includes performance of any of the processes in accordance with the present invention, in addition to any other process steps, including but not limited to coating or applying one or more additional layers, removing part of all of one or more additional layers, creating a pattern on a surface of a layer by applying, exposing and developing a photoresist and then removing portions of the layer defined by the pattern, forming interconnect holes through two or more layers, creating interconnects, etc.

The embodiment of the invention as shown in FIGS. 1–6 relates to a very simple circuit layout. As indicated above, the present invention is applicable in like manner to any circuit layout, as will be readily appreciated by those skilled in the art.

Also, in the embodiment of the invention as shown in FIGS. 1–6, the correction areas are inserted before the alignment budget borders are inserted. According to the present invention, the insertions of these areas can be carried out in any order, or any particular insertions can be carried out simultaneously. For example, one or more correction areas could be added, followed by the insertion of one or more alignment budget borders, followed by the insertion of one or more correction areas, followed by the insertion of one or more alignment budget borders, followed by the simultaneous insertion of one or more correction areas and one or more alignment budget borders, etc. Where a circuit feature is provided with one or more correction areas as well as an alignment budget border, it is preferred that the correction areas be inserted before the alignment budget is inserted.

Figure 7:
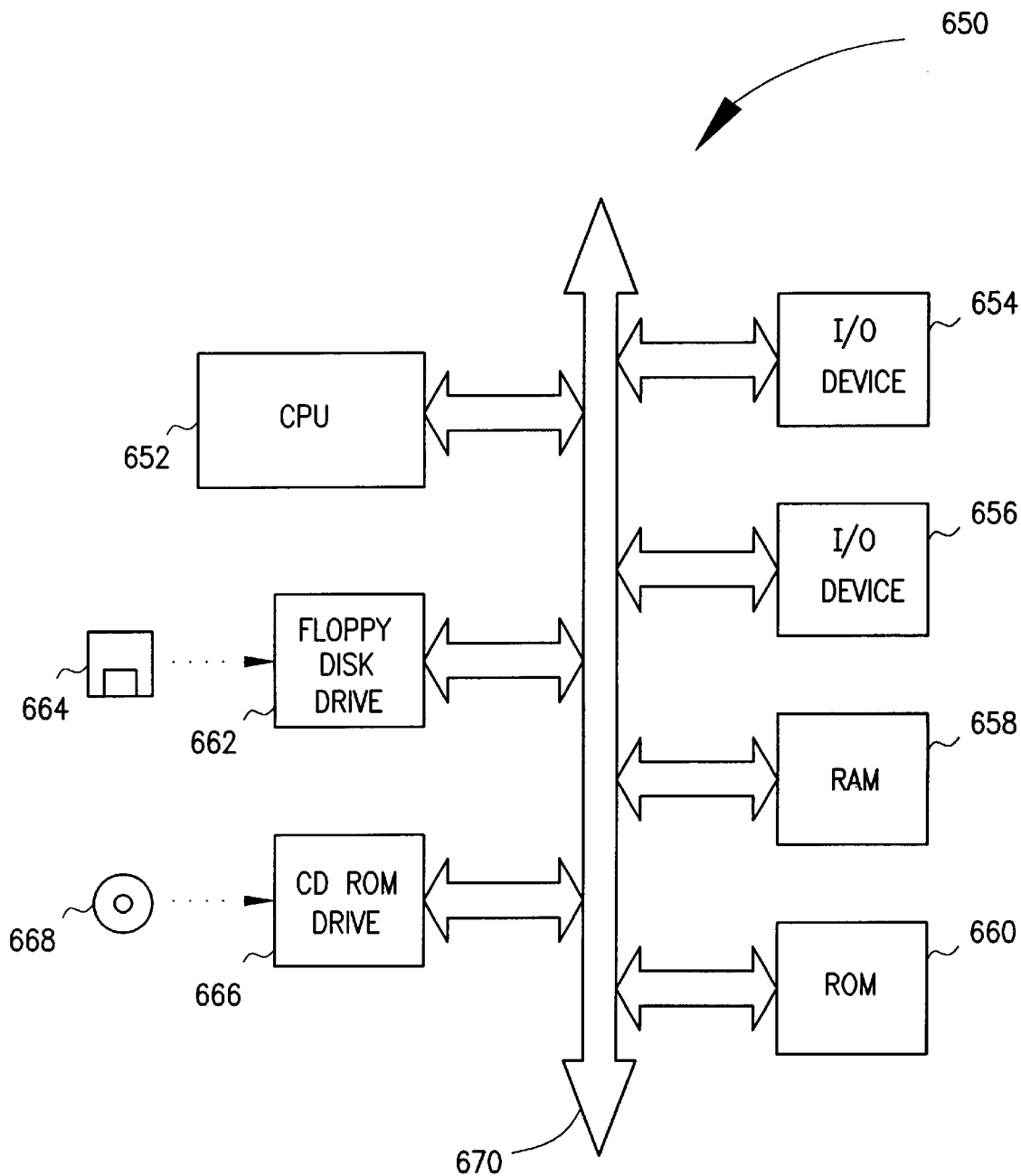
FIG. 7 is a schematic diagram of a computer system in which the process of the present invention can be implemented.

FIG. 7 depicts an example of a computer system 650 in which a process according to the present invention can be implemented. The system 650 includes a central processing unit (CPU) 652 that communicates with an input/output (I/O) device 654 over a bus 670. A second I/O device 656 is illustrated, but is not necessary to practice the present invention. The computer system 650 also includes random access memory (RAM), read only memory (ROM) 660 and may include peripheral devices such as a floppy disk drive 664 or a compact disk read only memory (CD-ROM) drive 666 that also communicate with the CPU 652 over the bus 670. The exact architecture of the computer system 650 is not critical, and any suitable combination of computer compatible devices may be incorporated into the system 650. In a preferred embodiment, the computer system 650 is a UNIX based workstation. Moreover, the program implementing the process of the present invention may be stored in ROM 608, a CD-ROM 668, a floppy disk 664, a hard disk drive, or any other medium capable of storing a computer program and data required by the program. In addition, the computer program or programs used in the process of the present invention may be transmitted over a communications network as downloaded, for example, transmitted from a server computer or another computer connected to the computer system 650 which downloads the program or programs. The process of the present invention can be executed in a distributed manner over several computer systems 650, whether connected by a network or not, to process different tasks associated with formation of a reticle, in parallel fashion. One or more of the features contained in the devices shown in FIG. 7 can be made using reticles designed in accordance with the present invention.

Although the articles and methods in accordance with the present invention have been described in connection with preferred embodiments, it will be appreciated by those skilled in the art that modifications not specifically described may be made without departing from the spirit and scope of the invention. Accordingly, the invention is not limited by the foregoing description, but is only limited by the scope of the appended claims.

What is claimed is:

1. A method for designing a reticle, comprising:
generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area; and removing said overlap from said at least one correction area in said modified reticle layout to form at least one modified correction area, thereby forming a final reticle layout.

2. A method as recited in claim 1, further comprising checking said final reticle layout to analyze differences between features contained in said circuit layout and a pattern that will be produced by exposing a resist through a reticle corresponding to said final reticle layout.

3. A method as recited in claim 2, further comprising altering said final reticle layout depending on said differences.

4. A method as recited in claim 1, wherein said final reticle layout is generated on a computer.

5. A method as recited in claim 1, further comprising forming a reticle comprising transparent areas at locations corresponding to locations in said final reticle layout where said printable features and said at least one correction area are located.

6. A method as recited in claim 1, further comprising forming a reticle comprising transparent areas at locations corresponding to locations in said final reticle layout other than where said printable features and said at least one correction area are located.

7. A method as recited in claim 1, further comprising:

removing said alignment budget border area from said alignment budget-containing reticle layout to form a second final reticle layout.

8. A method as recited in claim 7, further comprising:

forming a first reticle comprising transparent areas at locations corresponding to locations in said first final reticle layout where said at least one first printable feature and said at least one correction area are located; and forming a second reticle comprising transparent areas at locations corresponding to locations in said second final reticle layout where said at least one second printable feature is located.

9. A method as recited in claim 7, further comprising:

forming a first reticle comprising transparent areas at locations corresponding to locations in said first final reticle layout other than where said at least one first printable feature and said at least one correction area are located; and forming a second reticle comprising transparent areas at locations corresponding to locations in said second final reticle layout other than where said at least one second printable feature is located.

10. A method for designing a reticle, comprising:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a first modified reticle layout, said first modified reticle layout comprising said first initial reticle layout and at least one first layout correction area;

generating a second modified reticle layout, said second modified reticle layout comprising said second initial reticle layout and at least one second layout correction area;

generating an alignment budget-containing reticle layout comprising said second modified reticle layout and at least one alignment budget border area around said second at least one second printable reticle feature and said at least one second layout correction area;

positioning said first modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one first layout correction area and said at least one alignment budget border area;

removing said overlap from said at least one first layout correction area in said first modified reticle layout to form a first final reticle layout; and removing said alignment budget border area from said alignment budget-containing reticle layout to form a second final reticle layout.

11. A method as recited in claim 10, further comprising:

forming a first reticle comprising transparent areas at locations corresponding to locations in said first final reticle layout where said at least one first printable feature and said at least one first layout correction area are located; and forming a second reticle comprising transparent areas at locations corresponding to locations in said second final reticle layout where said at least one second printable feature and said at least one second layout correction area are located.

12. A method as recited in claim 10, further comprising:

forming a first reticle comprising transparent areas at locations corresponding to locations in said first final reticle layout other than where said at least one first printable feature and said at least one first layout correction area are located; and forming a second reticle comprising transparent areas at locations corresponding to locations in said second final reticle layout other than where said at least one second printable feature and said at least one second layout correction area are located.

13. A method for designing a reticle, comprising:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating a budget-containing reticle layout comprising said second initial reticle layout and at least one budget border area, said budget border area including alignment budget and process budget;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one budget border area;

removing said overlap from said at least one correction area in said modified reticle layout to form a first final reticle layout; and removing said budget border area from said alignment budget-containing reticle layout to form a second final reticle layout.

14. A method as recited in claim 13, further comprising:

forming a first reticle comprising transparent areas at locations corresponding to locations in said first final reticle layout where said at least one first printable feature and said at least one correction area are located; and forming a second reticle comprising transparent areas at locations corresponding to locations in said second final reticle layout where said at least one second printable feature is located.

15. A method as recited in claim 13, further comprising:

forming a first reticle comprising transparent areas at locations corresponding to locations in said first final reticle layout other than where said at least one first printable feature and said at least one correction area are located; and forming a second reticle comprising transparent areas at locations corresponding to locations in said second final reticle layout other than where said at least one second printable feature is located.

16. A reticle comprising:

at least one substantially opaque section having an opaque section pattern; and at least one substantially transparent section having a transparent section pattern, said opaque section pattern and said transparent section pattern being formed by:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area;

removing said overlap from said at least one correction area in said modified reticle layout to form at least one modified correction area, thereby forming a final reticle layout; and forming a reticle comprising opaque areas and transparent areas, one of said opaque areas as transparent areas being positioned at locations corresponding to locations in said final reticle layout where said printable features and said at least one correction area are located.

17. A reticle as recited in claim 16, wherein said final reticle layout is generated on a computer.

18. A reticle as in claim 15 wherein opaque areas are positioned at locations corresponding to locations in said final reticle layout where said printable features are said at least one connection area are located.

19. A reticle as in claim 15 wherein transparent areas are positioned at locations corresponding to locations in said final reticle layout where said printable features are said at least one connection area are located.

20. A phase shift reticle comprising:

at least one phase shift section having a phase shift pattern; and at least one substantially transparent section having a transparent section pattern, said phase shift pattern and said transparent section pattern being formed by:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area;

removing said overlap from said at least one correction area in said modified reticle layout to form at least one modified correction area, thereby forming a final reticle layout; and forming a reticle comprising phase shift areas and transparent areas, one of said phase shift areas and said transparent areas being positioned at locations corresponding to locations in said final reticle layout where said printable features and said at least one correction area are located.

21. A phase shift reticle as recited in claim 20, wherein said final reticle layout is generated on a computer.

22. A phase shift reticle as recited in claim 20, wherein said phase shift areas comprise phase shift areas and attenuated phase shift areas.

23. A phase shift reticle as in claim 20 wherein said transparent areas are positioned at locations corresponding to locations in said final reticle layout where said printable features and said at least one correction area are located.

24. A phase shift reticle as in claim 20 wherein said phase shift areas are positioned at locations corresponding to locations in said final reticle layout where said printable features and said at least one correction area are located.

25. A photolithographic process, comprising:

directing exposure onto a resist through a reticle, said reticle comprising:

at least one substantially opaque section having an opaque section pattern; and at least one substantially transparent section having a transparent section pattern, said opaque section pattern and said transparent section pattern being formed by:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area;

removing said overlap from said at least one correction area in said modified reticle layout to form at least one modified correction area, thereby forming a final reticle layout; and forming a reticle comprising opaque areas and transparent areas, one of said opaque areas and said transparent areas being positioned at locations corresponding to locations in said final reticle layout where said printable features and said at least one correction area are located.

26. A photolithic process as in claim 25 wherein transparent areas are positioned at locations corresponding to locations in said final reticle layout where said printable features and said at least one correction area are located.

27. A photolithic process as in claim 25 wherein opaque areas are positioned at locations corresponding to locations in said final reticle layout where said printable features and said at least one correction area are located.

28. A photolithographic process, comprising:

directing exposure onto a resist through a reticle, said reticle comprising:

at least one phase shift section having a phase shift pattern; and at least one substantially transparent section having a transparent section pattern, said phase shift pattern and said transparent section pattern being formed by:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area;

removing said overlap from said at least one correction area in said modified reticle layout to form at least one modified correction area, thereby forming a final reticle layout; and forming a reticle comprising phase shift areas and transparent areas, one of said phase shift areas and said transparent areas being positioned at locations corresponding to locations in said final reticle layout where said printable features and said at least one correction area are located.

29. A photolithographic process as in claim 28 wherein said transparent areas are positioned at locations corresponding to locations in said final reticle layout where said printable features and said at least one correction area are located.

30. photolithographic process as in claim 28 wherein said phase shift areas are positioned at locations corresponding to locations in said final reticle layout where said printable features and said at least one correction area are located.

31. A computer readable storage medium containing a computer readable code for operating a computer to perform a method of designing a reticle, said method comprising:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device; generating a modified reticle layout, said modified reticle layout comprising said first initial reticle layout and at least one correction area;

generating an alignment budget-containing reticle layout comprising said second initial reticle layout and at least one alignment budget border area;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one alignment budget border area; and removing said overlap from said at least one correction area in said modified reticle layout to form at least one modified correction area, thereby forming a final reticle layout.

32. A computer readable storage medium as recited in claim 31, wherein said reticle is a binary mask.

33. A computer readable storage medium as recited in claim 31, wherein said reticle is a phase shift mask.

34. A computer readable storage medium as recited in claim 31, wherein said reticle is an attenuated phase shift mask.

35. A computer readable storage medium as in claim 31, wherein said method further comprises:

removing said alignment budget border area from said alignment budget-containing reticle layout to form a second final reticle layout.

36. A computer readable storage medium containing a computer readable code for operating a computer to perform a method of designing a reticle, said method comprising:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a first modified reticle layout, said first modified reticle layout comprising said first initial reticle layout and at least one first layout correction area;

generating a second modified reticle layout, said second modified reticle layout comprising said second initial reticle layout and at least one second layout correction area;

generating an alignment budget-containing reticle layout comprising said second modified reticle layout and at least one alignment budget border area around said second at least one second printable reticle feature and said at least one second layout correction area;

positioning said first modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one first layout correction area and said at least one alignment budget border area;

removing said overlap from said at least one first layout correction area in said first modified reticle layout to form a first final reticle layout; and removing said alignment budget border area from said alignment budget-containing reticle layout to form a second final reticle layout.

37. A computer readable storage medium as recited in claim 36, wherein said reticle is a binary mask.

38. A computer readable storage medium as recited in claim 36, wherein said reticle is a phase shift mask.

39. A computer readable storage medium as recited in claim 36, wherein said reticle is an attenuated phase shift mask.

40. A computer readable storage medium containing a computer readable code for operating a computer to perform a method of designing a reticle, said method comprising:

generating at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generating a modified reticle layout, said modified reticle layout comprising said first initial reticle layout and at least one correction area;

generating a budget-containing reticle layout comprising said second initial reticle layout and at least one budget border area, said budget border area including alignment budget and process budget;

positioning said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determining any overlap between said at least one correction area and said at least one budget border area;

removing said overlap from said at least one correction area in said modified reticle layout to form a first final reticle layout; and removing said budget border area from said alignment budget-containing reticle layout to form a second final reticle layout.

41. A computer readable storage medium as recited in claim 40, wherein said reticle is a binary mask.

42. A computer readable storage medium as recited in claim 40, wherein said reticle is a phase shift mask.

43. A computer readable storage medium as recited in claim 40, wherein said reticle is an attenuated phase shift mask.

44. A processor system, comprising:
a computer readable storage medium containing program instructions for execution by a processor to design a reticle; and
a processor in communication with said computer readable storage medium, said processor executing said program instructions stored on said computer readable storage medium to:
generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;
generate a modified reticle layout, said modified reticle layout comprising said first initial reticle layout and at least one correction area;
generate an alignment budget-containing reticle layout comprising said second initial reticle layout and at least one alignment budget border area;
position said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;
determine any overlap between said at least one correction area and said at least one alignment budget border area; and
remove said overlap from said at least one correction area in said modified reticle layout to form at least one modified correction area, thereby forming a final reticle layout.

45. A system as recited in claim 44, wherein said reticle is a binary mask.

46. A system as recited in claim 44, wherein said reticle is a phase shift mask.

47. A system as recited in claim 44, wherein said reticle is an attenuated phase shift mask.

48. A processor system, as in claim 44, wherein said processor is further responsive to said program instructions to:
remove said alignment budget border area from said alignment budget-containing reticle layout to form a second final reticle layout.

49. A processor system, comprising:
a computer readable storage medium containing program instructions for execution by a processor to design a reticle; and
a processor in communication with said computer readable storage medium, said processor executing said program instructions stored on said computer readable storage medium to:
generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;
generate a first modified reticle layout, said second modified reticle layout comprising said first initial reticle layout and at least one first layout correction area;
generate a second modified reticle layout, said second modified reticle layout comprising said second initial reticle layout and at least one second layout correction area;
generate an alignment budget-containing reticle layout comprising said second modified reticle layout and at least one alignment budget border area around said second at least one second printable reticle feature and said at least one second layout correction area;
position said first modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;
determine any overlap between said at least one first layout correction area and said at least one alignment budget border area;
remove said overlap from said at least one first layout correction area in said first modified reticle layout to form a first final reticle layout; and
remove said alignment budget border area from said alignment budget-containing reticle layout to form a second final reticle layout.

50. A system as recited in claim 49, wherein said reticle is a binary mask.

51. A system as recited in claim 49, wherein said reticle is a phase shift mask.

52. A system as recited in claim 49, wherein said reticle is an attenuated phase shift mask.

53. A processor system, comprising:
a computer readable storage medium containing program instructions for execution by a processor to design a reticle; and
a processor in communication with said computer readable storage medium, said processor executing said program instructions stored on said computer readable storage medium to:
generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;
generate a modified reticle layout, said modified reticle layout comprising said first initial reticle layout and at least one correction area;
generate a budget-containing reticle layout comprising said second initial reticle layout and at least one budget border area, said budget border area including alignment budget and process budget;
position said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determine any overlap between said at least one correction area and said at least one budget border area;

remove said overlap from said at least one correction area in said modified reticle layout to form a first final reticle layout; and remove said budget border area from said alignment budget-containing reticle layout to form a second final reticle layout.

54. A system as recited in claim 53, wherein said reticle is a binary mask.

55. A system as recited in claim 53, wherein said reticle is a phase shift mask.

56. A system as recited in claim 53, wherein said reticle is an attenuated phase shift mask.

57. A system for designing a reticle comprising:
a plurality of computer systems, each computer system comprising:
   a computer readable storage medium containing program instructions for execution by a processor to design and/or check a reticle; and
   a processor in communication with said computer readable storage medium, said processor executing said program instructions stored on said computer readable medium, said plurality of computer systems operating in conjunction with each other to:
      generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;
      generate a modified reticle layout, said modified reticle layout comprising said first initial reticle layout and at least one correction area;
      generate an alignment budget-containing reticle layout comprising said second initial reticle layout and at least one alignment budget border area;
      position said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;
      determine any overlap between said at least one correction area and said at least one alignment budget border area; and
      remove said overlap from said at least one correction area in said modified reticle layout to form at least one modified correction area, thereby forming a final reticle layout,
wherein each computer system processes different tasks associated with formation of said reticle.

58. A system as in claim 57 wherein said plurality of computer systems work in conjunction to further:
   remove said alignment budget border area from said alignment budget-containing reticle layout to form a second final reticle layout.

59. A system for designing a reticle comprising:
a plurality of computer systems, each computer system comprising:
   a computer readable storage medium containing program instructions for execution by a processor to design and/or check a reticle; and
   a processor in communication with said computer readable storage medium, said processor executing said program instructions stored on said computer readable medium, said plurality of computer systems operating in conjunction with each other to:
      generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;
      generate a first modified reticle layout, said second modified reticle layout comprising said first initial reticle layout and at least one first layout correction area;
      generate a second modified reticle layout, said second modified reticle layout comprising said second initial reticle layout and at least one second layout correction area;
      generate an alignment budget-containing reticle layout comprising said second modified reticle layout and at least one alignment budget border area around said second at least one second printable reticle feature and said at least one second layout correction area;
      position said first modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;
      determine any overlap between said at least one first layout correction area and said at least one alignment budget border area;
      remove said overlap from said at least one first layout correction area in said first modified reticle layout to form a first final reticle layout; and
      remove said alignment budget border area from said alignment budget-containing reticle layout to form a second final reticle layout,
wherein each computer system processes different tasks associated with formation of said reticle.

60. A system for designing a reticle comprising:
a plurality of computer systems, each computer system comprising:
   a computer readable storage medium containing program instructions for execution by a processor to design and/or check a reticle; and
   a processor in communication with said computer readable storage medium, said processor executing said program instructions stored on said computer readable medium, said plurality of computer systems operating in conjunction with each other to:
      generate at least a first initial reticle layout and a second initial reticle layout, said first initial reticle layout comprising at least one first printable reticle feature, said second initial reticle layout comprising at least one second printable reticle feature, said at least one first printable reticle feature and said at least one second printable reticle feature to be provided according to a circuit feature layout on a single layer of a semiconductor device;

generate a modified reticle layout, said modified reticle layout comprising said first initial reticle layout and at least one correction area;

generate a budget-containing reticle layout comprising said second initial reticle layout and at least one budget border area, said budget border area including alignment budget and process budget;

position said modified reticle layout and said alignment budget-containing reticle layout such that the relative alignment of said at least one first printable reticle feature and said at least one second printable reticle feature is the same as the relative alignment of said at least one first printable reticle feature and said at least one second printable feature in said circuit feature layout;

determine any overlap between said at least one correction area and said at least one budget border area;

remove said overlap from said at least one correction area in said modified reticle layout to form a first final reticle layout; and remove said budget border area from said alignment budget-containing reticle layout to form a second final reticle layout, wherein each computer system processes different tasks associated with formation of said reticle.

* * * * *